(12) United States Patent
Oliveto et al.

(10) Patent No.: US 12,408,479 B2
(45) Date of Patent: Sep. 2, 2025

(54) ASYMMETRIC LIGHT TRANSMISSION SURFACES FOR ENHANCING EFFICIENCY OF SOLAR CONCENTRATORS

(71) Applicant: Rensselaer Polytechnic Institute, Troy, NY (US)

(72) Inventors: Vincent James Oliveto, Troy, NY (US); Diana-Andra Borca-Tasciuc, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 18/033,380

(22) PCT Filed: Oct. 22, 2021

(86) PCT No.: PCT/US2021/056175
§ 371 (c)(1),
(2) Date: Apr. 24, 2023

(87) PCT Pub. No.: WO2022/087355
PCT Pub. Date: Apr. 28, 2022

(65) Prior Publication Data
US 2023/0395738 A1    Dec. 7, 2023

Related U.S. Application Data

(60) Provisional application No. 63/104,615, filed on Oct. 23, 2020.

(51) Int. Cl.
| H10F 77/45 | (2025.01) |
| H10F 77/42 | (2025.01) |
| H10F 77/70 | (2025.01) |

(52) U.S. Cl.
CPC .......... H10F 77/45 (2025.01); H10F 77/488 (2025.01); H10F 77/707 (2025.01)

(58) Field of Classification Search
CPC ..................................................... H01L 31/055
See application file for complete search history.

(56) References Cited

U.S. PATENT DOCUMENTS

| 8,324,497 B2 | 12/2012 | Brounne et al. |
| 8,674,281 B2 | 3/2014 | Schmaelzle et al. |
| (Continued) | | |

FOREIGN PATENT DOCUMENTS

| CA | 2895654 A1 | 6/2014 |
| WO | 2018009530 A1 | 1/2018 |
| WO | 2020035799 A1 | 2/2020 |

OTHER PUBLICATIONS

International Search Report and the Written Opinion of the International Searching Authority, International Application No. PCT/US2021/056175, mailed Feb. 17, 2022.

*Primary Examiner* — Ryan S Cannon
(74) *Attorney, Agent, or Firm* — Barclay Damon LLP; Anthony P. Gangemi (57) ABSTRACT

A luminescent solar concentrator including a light propagation device, one or more photovoltaic cells, and one or more waveguides is provided. The light propagation device includes a plurality of nanostructures configured to permit preferential propagation of a wavelength range of light in one direction. The one or more photovoltaic cells are positioned adjacent an end of the light propagation device. The one or more waveguides are configured to guide light toward the one or more photovoltaic cells via total internal reflection within the luminescent solar concentrator.

11 Claims, 5 Drawing Sheets

(56) References Cited

U.S. PATENT DOCUMENTS

| | | |
|---|---|---|
| 8,749,009 B2 | 6/2014 | Young et al. |
| 9,185,798 B2 | 11/2015 | Young et al. |
| 9,525,092 B2 | 12/2016 | Mayer et al. |
| 9,595,912 B2 | 3/2017 | Yamamoto et al. |
| 9,728,665 B2 | 8/2017 | Ronda et al. |
| 9,905,709 B2 | 2/2018 | Van Bommel et al. |
| 10,340,844 B2 | 7/2019 | Dong et al. |
| 10,345,563 B2 | 7/2019 | Kozodoy et al. |
| 10,396,228 B2 | 8/2019 | Mayer et al. |
| 10,439,090 B2 | 10/2019 | Lunt et al. |
| 10,700,234 B2 | 6/2020 | Saive et al. |
| 2008/0072958 A1 | 3/2008 | Dutta |
| 2009/0194160 A1* | 8/2009 | Chin .................... H01G 9/2027 438/85 |
| 2010/0139749 A1 | 6/2010 | Mapel |
| 2010/0139769 A1 | 6/2010 | Mapel |
| 2010/0180932 A1* | 7/2010 | Wang .................. H01L 31/0547 136/246 |
| 2010/0224231 A1 | 9/2010 | Hoke |
| 2010/0288352 A1 | 11/2010 | Ji et al. |
| 2013/0333693 A1* | 12/2013 | Hashimura ............ G02B 5/208 126/714 |
| 2014/0242744 A1 | 8/2014 | Fonash et al. |
| 2014/0311572 A1 | 10/2014 | De Boer et al. |
| 2015/0194555 A1 | 7/2015 | Zhang et al. |
| 2017/0324370 A1 | 11/2017 | Dong et al. |
| 2019/0148577 A1 | 5/2019 | Brovelli et al. |
| 2019/0245105 A1 | 8/2019 | Hughes et al. |
| 2020/0058814 A1 | 2/2020 | Ceroni et al. |
| 2021/0249546 A1* | 8/2021 | Neyts ................ G02F 1/133528 |

\* cited by examiner

ASYMMETRIC LIGHT TRANSMISSION SURFACES FOR ENHANCING EFFICIENCY OF SOLAR CONCENTRATORS

CROSS REFERENCE TO RELATED APPLICATION(S)

This application is a U.S. National Stage Application of, and claims the priority benefit of, International Patent Application No. PCT/US2021/056175, filed Oct. 22, 2021, which claims the priority benefit of U.S. Provisional Patent Application No. 63/104,615, filed Oct. 23, 2020, the contents of which are incorporated by reference as if disclosed herein in their entireties.

FIELD

The present technology generally relates to the area of solar concentrators. More particularly, the present technology relates to luminescent solar concentrators configured to achieve asymmetric light propagation.

BACKGROUND

Luminescent solar concentrators ("LSC") show great promise as a technology of the future for building-integrated photovoltaics ("BIPV"). According to current trends, solar related jobs have increased by 160% in the last decade, while installation costs have dropped by more than 70%. Recent data also shows that the global market for BIPV is expected to more than triple within the next 7 years. Over 80% of available energy is used in cities. Due to the high population density and the complex architecture of urban environments, it is exceedingly difficult to plan and implement solar installations. With a booming solar industry and a need for urban-based renewable energy, LSCs offer a viable solution.

LSCs work by concentrating large areas of sunlight to smaller photovoltaic cells imbedded on the sides. An LSC is typically made from a glass or plastic substrate that contains luminescent species (such as organic dye, quantum dots, or fluorophores), which can be either uniformly distributed throughout the matrix or concentrated on the bottom side of the LSC. These luminescent species have a specific absorption range and an emission range. Their purpose is to absorb light within a certain wavelength region and to emit light at a slightly lower energy level. This reemission causes the light to travel at more extreme angles to trigger total internal reflection ("TIR"), which is the phenomenon that allows LSCs to work. Specifically, total internal reflection causes the plastic matrix to act as a waveguide by focusing the light toward the edge where the photovoltaic cell is located.

Unfortunately, current LSCs are incredibly inefficient, with as much as 50-70% of light leaving via the escape cone on the top surface (i.e. light traveling within the LSC towards the top surface will escape the matrix unless it hits the surface under a narrow range of angles that depends on the index of refraction of the matrix material). Researchers have tried to address this problem by trying to reduce these top surface losses. Most attempts have been done through spectrally selective mirrors, Bragg reflectors, organic mirrors, and other photonic structures. Spectrally selective mirrors focus on being highly reflective in the "absorption range" and highly transmissive in the "emission range." Doped particles in the substrate of the LSC will absorb high energy light particles and emit them at lower energy wavelengths. The absorption range is a small range of wavelengths of approximately 200 nm. The design of the mirrors will allow these wavelengths to enter the LSC and prevent the emission range wavelengths of another 200 nm gap from leaving the structure. The Bragg reflectors, organic mirrors, and photonic structures all operate under a similar premise, but are constructed through different means.

However, all these attempts have focused around creating mirrors that are highly reflective in the emission wavelengths of the LSC on the inner side. This will effectively allow the wavelengths the LSC absorbs to enter the waveguide while "trapping" the emission wavelengths inside. These approaches, while beneficial to LSCs, only work for small bandgaps and prevent light from entering if they are in the emission wavelength range due to the attempt to trap that light inside.

Recently, researchers have also attempted to prove the concept of asymmetric light propagation. This concept of asymmetric light propagation is known as the Woods-Rayleigh anomaly, which was first discovered and quantified in the early 20th century. These researchers often cite optical diodes as a theoretical possible application. Another researcher showed asymmetric light propagation using nanostructures that can allow more light in one direction than the other. However, the nanostructures were simulated and formed of non-realistic materials, and only achieved results over a small bandgap.

Therefore, a need exists for improved luminescent solar concentrators that address the problems discussed above.

SUMMARY

According to an exemplary embodiment of the present technology, a luminescent solar concentrator including a light propagation device, one or more photovoltaic cells, and one or more waveguides is provided. The light propagation device includes a plurality of nanostructures configured to permit preferential propagation of a wavelength range of light in one direction. The one or more photovoltaic cells are positioned adjacent an end of the light propagation device. The one or more waveguides are configured to guide light toward the one or more photovoltaic cells via total internal reflection within the luminescent solar concentrator. In some embodiments, the one or more photovoltaic cells are positioned adjacent an end of one of the one or more waveguides.

In some embodiments, the wavelength range of light is 400 nm to 1200 nm.

In some embodiments, the wavelength range of light is 700 nm to 1050 nm.

In some embodiments, the plurality of nanostructures each have a generally pyramidal shape. In some embodiments, the plurality of nanostructures each have an aspect ratio of a top surface to a bottom surface of 0.55.

In some embodiments, the plurality of nanostructures each have a base width in the range of 200 nm to 800 nm and a height in the range of 200 nm to 800 nm.

In some embodiments, the plurality of nanostructures each have a base width of 550 nm and a height of 550 nm.

In some embodiments, the light propagation device further includes a plurality of substrates arranged such that each one of the plurality of nanostructures is positioned on a respective one of the plurality of substrates to form a plurality of nanostructure-substrate pairings.

In some embodiments, the plurality of substrates each have a width in the range of 400 nm to 1000 nm and a height in the range of 200 nm to 800 nm.

In some embodiments, the plurality of substrates each have a width of 700 nm and a height of 550 nm.

In some embodiments, the plurality of nanostructure-substrate pairings are arranged in a periodic array having a periodicity in the range of 100 nm to 1000 nm.

In some embodiments, the plurality of nanostructure-substrate pairings are arranged in a periodic array having a periodicity of 700 nm.

In some embodiments, the plurality of nanostructures comprises aluminum oxide.

In some embodiments, the plurality of substrates comprises polymethylmethacrylate.

According to another exemplary embodiment of the present technology, an asymmetric light propagation device including one or more nanostructures and one or more substrates is provided. The one or more nanostructures each include a generally pyramidal shape having a first height that is greater than or equal to a base width. The one or more substrates are optically coupled to the one or more nanostructures. The one or more substrates each have a cuboid shape. The one or more nanostructures are each configured to permit a first quantity of light to propagate in a forward direction and a second quantity of light to propagate in a backward direction. The first quantity of light is greater than the second quantity of light for a wavelength range.

In some embodiments, the wavelength range of light is 400 nm to 1200 nm.

In some embodiments, the wavelength range of light is 700 nm to 1050 nm.

In some embodiments, the base width is in the range of 200 nm to 800 nm and the first height is in the range of 200 nm to 800 nm.

In some embodiments, the one or more substrates each have a width in the range of 400 nm to 1000 nm and a second height in the range of 200 nm to 800 nm.

In some embodiments, the one or more nanostructures are each positioned on respective ones of the one or more substrates to form one or more nanostructure-substrate pairings.

In some embodiments, the asymmetric light propagation device further includes a plurality of nanostructure-substrate pairings arranged in a periodic array having a periodicity of 700 nm.

In some embodiments, the one or more nanostructures each include aluminum oxide and the one or more substrates each include polymethylmethacrylate.

Further objects, aspects, features, and embodiments of the present technology will be apparent from the drawing figures and below description.

DETAILED DESCRIPTION

Accordingly, embodiments of the present technology are directed to a luminescent solar concentrator ("LSC") that utilizes asymmetric light propagation to achieve a broadband wavelength absorption range and a minimal emission wavelength range. In some embodiments, the LSC has nanostructures on a surface that form interfaces having asymmetric transmission properties to decrease the light losses in the LSC. In some embodiments, the nanostructures are arranged in a periodic array on a surface of the LSC such that the nanostructures effectively trap light inside the LSC.

Figure 1:
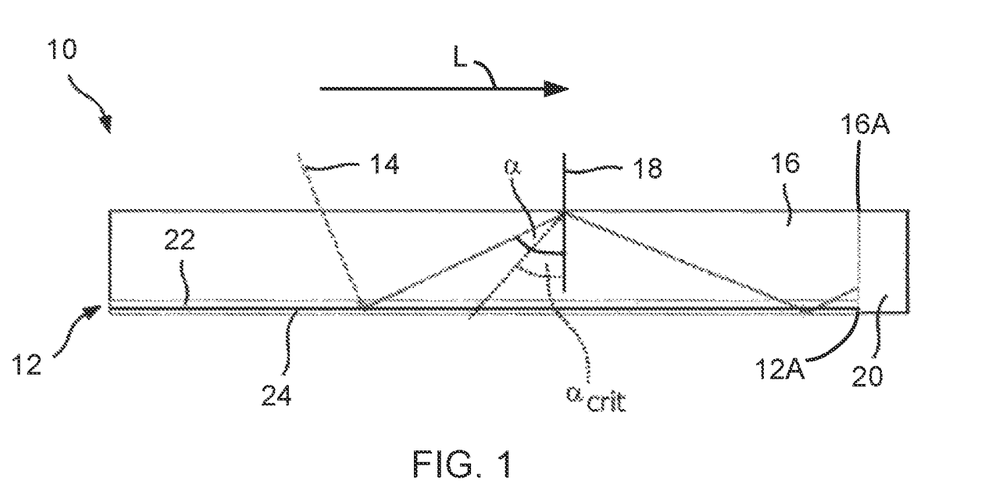
FIG. 1 is a schematic view of a luminescent solar concentrator according to an exemplary embodiment of the present technology.

FIG. 1 shows an LSC 10 according to an exemplary embodiment of the present technology. The LSC 10 has a light propagation device 12 that is configured to permit asymmetric light propagation for a broadband wavelength of light within the LSC 10. In some embodiments, the LSC 10 includes any means of luminescence conversion known in the art, such as doped particles that absorb incident light 14 (the dashed line in FIG. 1) and emit light at longer wavelengths into a waveguide 16. Although the embodiment shown in FIG. 1 shows the light propagation device 12 positioned on a bottom surface of the LSC 10, the present technology is not limited thereto and contemplates one or more light propagation devices 12 being positioned at any surface of the LSC 10 that serves as an interface between the LSC 10 and the surrounding medium (e.g., air), including but not limited to the bottom surface, the top surface, the side surfaces, the end surfaces, or combinations thereof.

In some embodiments, the waveguide 16 is formed of a plastic or glass sheet extending parallel to the view plane and is positioned to at least partially surround the light propagation device 12. The waveguide 16 is configured to guide light by total internal reflection in directions essentially parallel to the longitudinal axis L of the LSC 10, provided that the light travels within the waveguide 16 and approaches a boundary between the waveguide 16 and the surrounding air at an angle α that is larger than a critical angle $\alpha_{crit}$, which in some embodiments is 42° for a refractive index of 1.5 of the waveguide 16, with respect to a vertical direction 18.

The LSC 10 includes a photovoltaic cell 20 that is positioned adjacent to an end 12A of the light propagation device 12 and an end 16A of the waveguide 16. The photovoltaic cell 20 collects the light that is trapped inside the waveguide 16 by total internal reflection. The photovoltaic cell 20 is configured to convert energy of the collected light to electric energy in any manner that is known to those of skill in the art.

Figure 2:
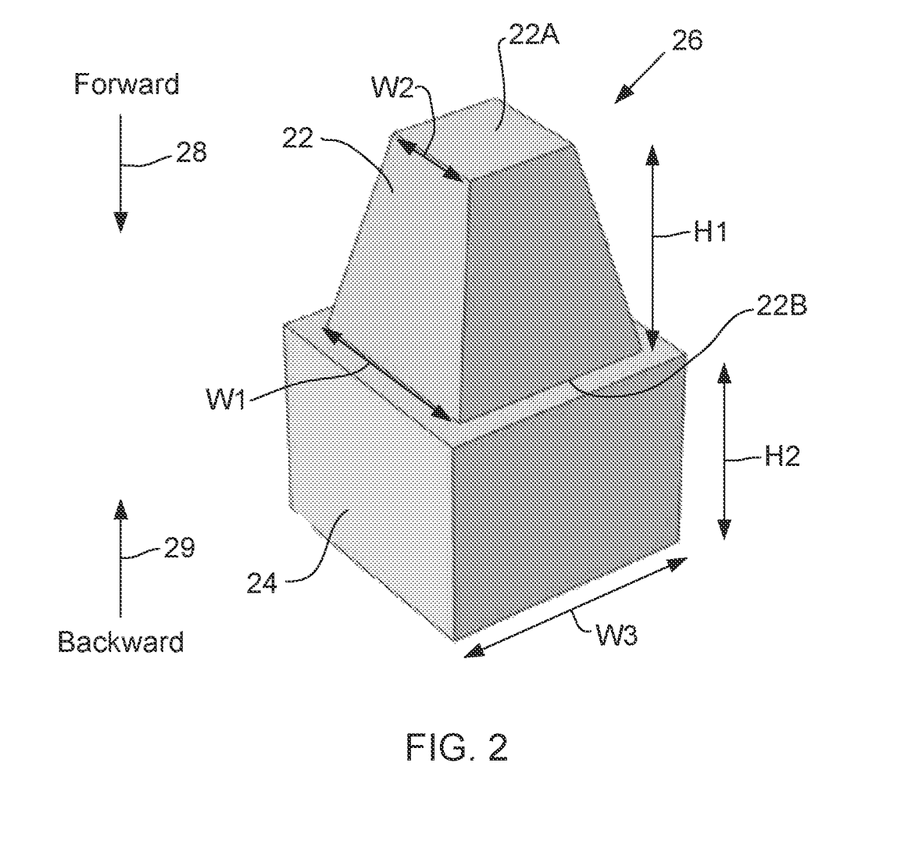
FIG. 2 is a perspective view of an exemplary embodiment of the nanostructures used to achieve asymmetric light propagation in the luminescent solar concentrators of the present technology.

The light propagation device 12 includes a plurality of nanostructures 22 that are configured to permit asymmetric light propagation (i.e. preferential propagation of light in one direction) for a broadband wavelength of light. In some embodiments, the light propagation device 12 includes a plurality of substrates 24 that are optically coupled to the plurality of nanostructures 22. Each one of the plurality of nanostructures 22 is preferably positioned on a respective one of the plurality of substrates 24 to form a plurality of nanostructure-substrate pairings 26, as shown in FIG. 2.

In some embodiments, the light propagation device 12 has a periodic structure in at least one direction. As used herein, the term "periodic structure" means a structure in which a certain feature thereof is repeated in regular distances in a direction (i.e. periodicity). In some embodiments, the repeated feature includes a combination of several features of the structure, such as the nanostructure-substrate pairings 26 of the light propagation device 12. In some embodiments, the nanostructure-substrate pairings 26 form a periodic structure in at least one direction having a periodicity in the range of 100 nm to 1000 nm. In preferred embodiments, the nanostructure-substrate pairings 26 form a periodic structure in two directions (i.e. a periodic array) having a periodicity of 700 nm. The researchers of the present technology have surprisingly discovered that embodiments utilizing the periodic array of the nanostructure-substrate pairings 26 having a periodicity of 700 nm yields optimal asymmetric light propagation for the broadband wavelengths of light discussed in more detail below.

The Woods-Rayleigh anomaly can be expressed in a way such that the most effective wavelengths for asymmetric light propagation can be determined using the following equation:

$$\lambda = pn(1 + \sin \theta) \quad (1)$$

where $\lambda$ is the wavelength, p is periodic width (i.e. periodicity) of the nanostructure-substrate pairings 26, and n is the refractive index of the material at which the light ends. In some embodiments, only normally incident light is investigated and, thus, the sine function disappears because the angle is zero. In some embodiments, by using this equation and knowing the average index of refraction for the substrate 24, an effective range was calculated for the forward and backward direction for a nanostructure-substrate pairing 26. In embodiments of an LSC 10 using silicon photovoltaic cells 20, the desired range for engineering transmission properties is 700-1100 nm, because these wavelengths are the most efficiently converted by these photovoltaic cells 20. Based on this range, in some embodiments, the appropriate periodicity was calculated and used to determine an effective wavelength range of 700 nm to 1050 nm. This effective range means that within these wavelengths all diffraction orders will be able to propagate in the "forward" direction (the arrow labeled 28 in FIG. 2), but only the zeroth diffraction order will be able to propagate in the "backward" direction (the arrow labeled 29 in FIG. 2).

FIG. 2 shows a nanostructure-substrate pairing 26 according to an exemplary embodiment of the present technology. In some embodiments, the nanostructure 22 is formed of aluminum oxide, and the substrate 24 is formed of polymethylmethacrylate ("PMMA"). PMMA was chosen because it is a suitable LSC substrate material, it is already commonly found in buildings and construction, and it is easy to manufacture/buy. Aluminum oxide was chosen for similar reasons, as it is relatively simple to manufacture and is also common to find in buildings. In some embodiments, the substrate 24 is formed of a PMMA glass material.

In the embodiment shown in FIG. 2, the nanostructure 22 has a generally pyramidal shape having a height H1 that is greater than or equal to a base width W1. Each side of the nanostructure 22 has a trapezoidal shape such that the top width W2 is less than the base width W1. In some embodiments, the aspect ratio of the top surface 22A to the bottom surface 22B of the pyramidal nanostructure 22 is 0.55. In some embodiments, the base width W1 is in the range of 200 nm to 800 nm. In some embodiments, the height H1 is in the range of 200 nm to 800 nm. In preferred embodiments, the base width W1 is 550 nm and the height H1 is 550 nm.

In the embodiments shown in FIG. 2, the substrate 24 has a cuboid shape having a width W3 that is greater than a height H2. In some embodiments, the width W3 is in the range of 400 nm to 1000 nm. In some embodiments, the height H2 is in the range of 200 nm to 800 nm. In preferred embodiments, the width W3 is 700 nm and the height H2 is 550 nm.

The nanostructure-substrate pairing 26 shown in FIG. 2 was designed based on large amounts of research and investigation. Each of the geometric values went through parametric sweeps to optimize the geometry for application to LSCs. In some embodiments, in setting up a model for testing, a "box" of air having a height three times the height H2 was placed on top of the PMMA substrate 24 so that light could propagate downwards through a real medium. Floquet periodic conditions were placed on the front and back, as well as the left and right sides. In some embodiments, COMSOL was used to calculate the correct number of diffraction orders. A port boundary was set on the top surface of the "air box" and a second port boundary was placed on the bottom surface of the PMMA substrate 24. For the forward direction 28, the upper port had wave excitation turned on with a power of 1 W and 1 V/m electric field propagating in the x-direction. The lower port had the small settings except that the wave excitation is turned off. These parameters were vice versa for the backward direction 29. The mesh used is the predefined "finer" mesh for all geometric components. A mesh analysis showed that a smaller mesh than this did not result in a statistically significant change in the results.

Although the nanostructure-substrate pairing 26 shown in FIG. 2 includes a generally pyramidal shape nanostructure 22 and a cuboid shape substrate 24, the present technology is not limited thereto and contemplates embodiments having other shapes, including but not limited to the nanostructure 22 and/or the substrate 24 being gratings, cubes, hexagonal prisms, cylinders, hemispheres, etc., provided that the dimensions and periodicity are within the ranges discussed herein to yield optimal asymmetric light propagation.

Figure 3:
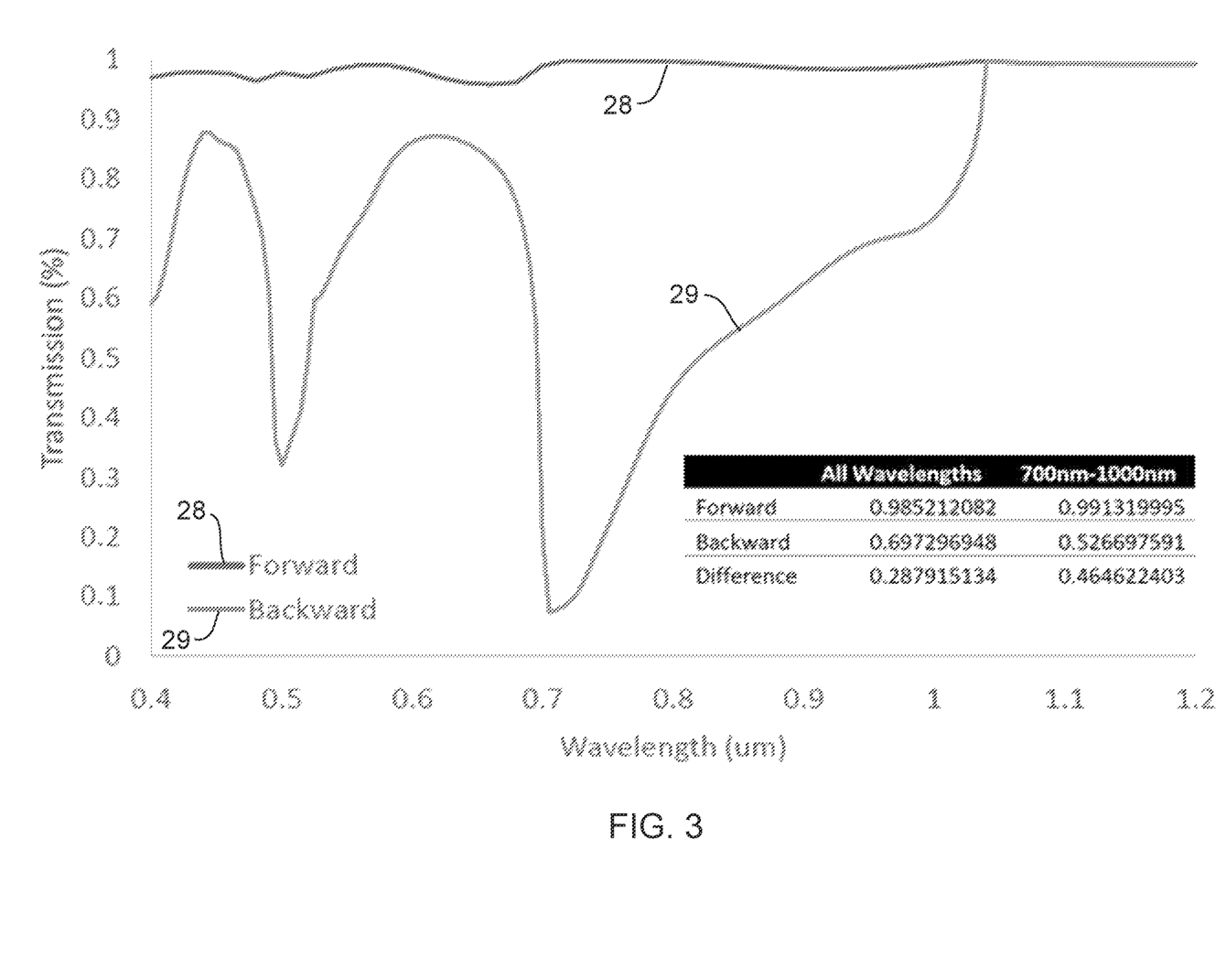
FIG. 3 is a chart showing the forward and backward transmissions for the nanostructure of FIG. 2 at a normal incident angle. The table shows the average total transmissions in the forward and backward directions for all wavelengths and an exemplary range of 700 nm to 1000 nm. The table also shows the difference between these two wavelength ranges.

In some embodiments, a wavelength domain simulation was performed on the LSC 10 within a range of wavelengths from 400 nm to 1200 nm at 20 nm incremental steps. As shown in FIG. 3, the nanostructures 22 were successful in exhibiting asymmetric light propagation within the full range of 400 nm to 1200 nm and were particularly effective in the previously calculated optimal range of 700 nm to 1000 nm. At 700 nm the difference reaches approximately 92%, while the average difference in the optimal range is approximately 45%. However, this simulation only shows results for normally incident light. In some embodiments, to make the simulation more realistic, additional parametric sweeps were conducted to gather data on a range of incident angles. This simulation was set up the same as the simulation discussed above, except an additional parametric sweep study was added to run cases of incident angles starting at 0° and increasing incrementally by 5° to a final position of 80°. The results of this are shown in FIG. 4.

Figure 4:
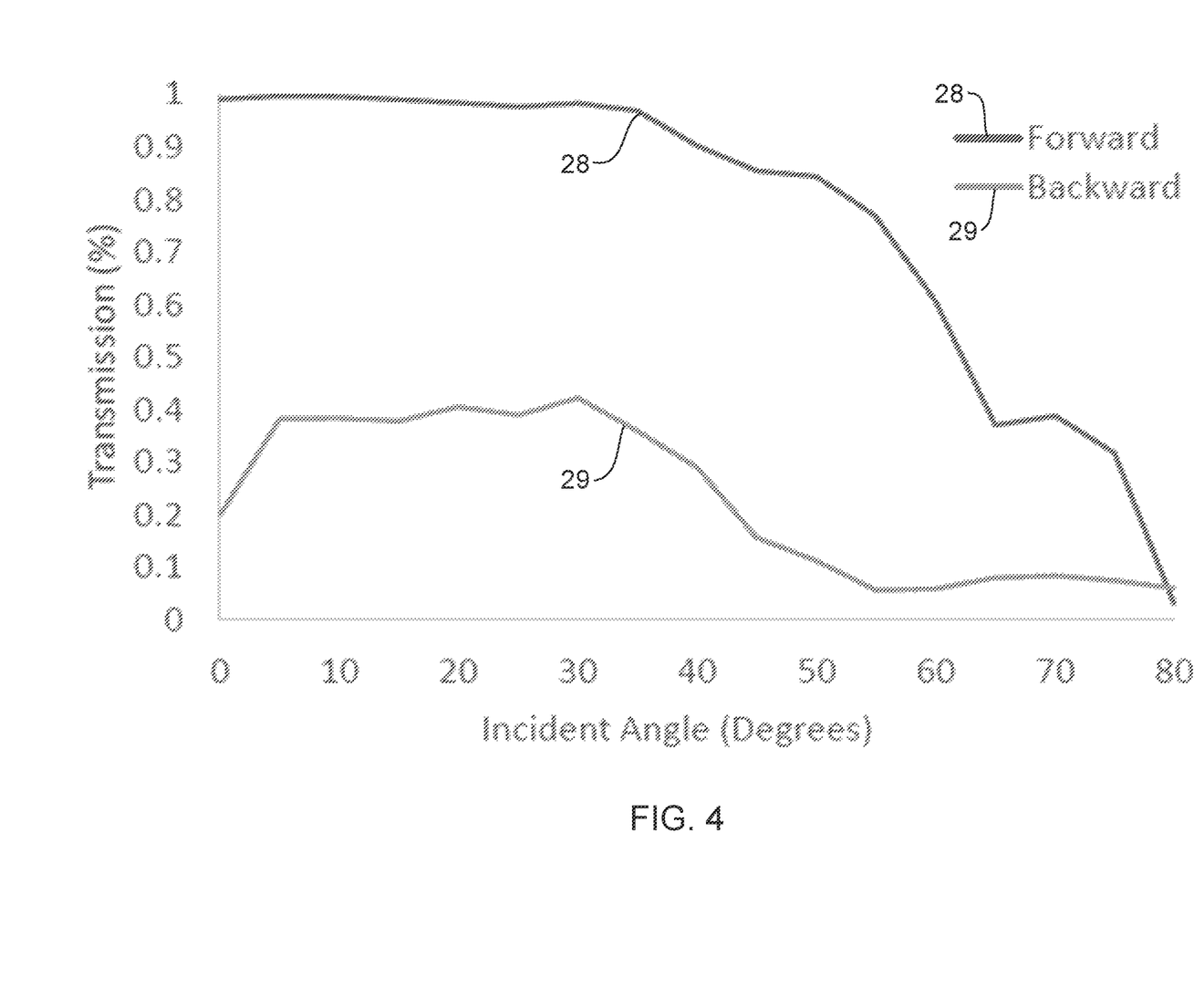
FIG. 4 is a chart showing the results of total transmission in the forward and backward directions for a 700 nm wavelength over a sweep of incident angles.

FIG. 4 shows the results from the wavelength at the beginning of the calculated effective range at 700 nm. It can be clearly seen that the asymmetric light transmission continues to occur over all incident angles. The total transmission decreases as the incident angle increases. This makes sense, because as the light source or "sun" begins to set, a more extreme incident angle is produced, and less light makes it through the structure. Finally, the transmission data for all simulated wavelengths and all incident angles was averaged and compiled in the chart shown in FIG. 5.

Figure 5:
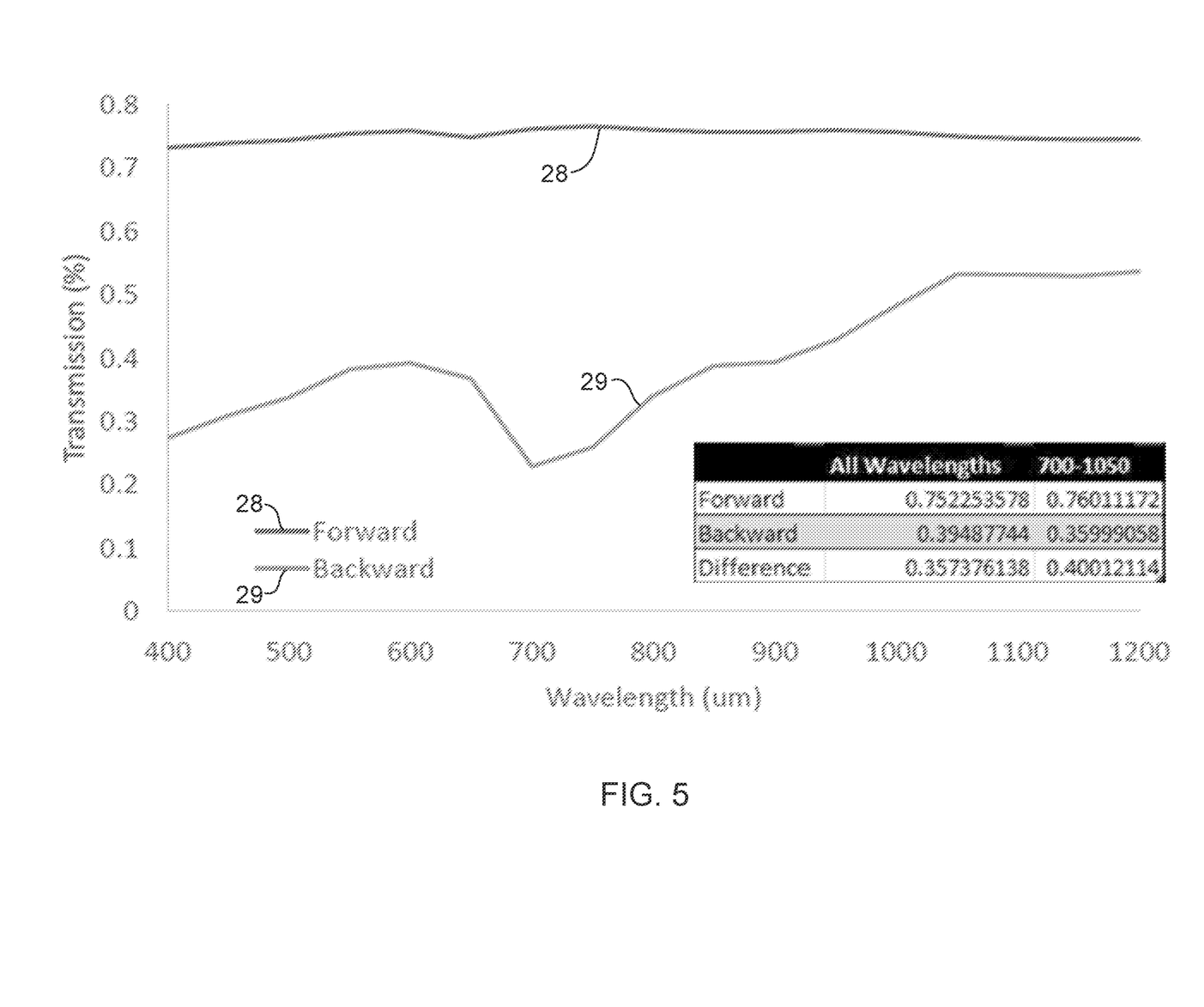
FIG. 5 is a chart showing each wavelength from 400 nm to 1200 nm in 50 nm increments over incident angles from 0° to 80°. Each increment was averaged across all incident angles and applied as a data point. The averages are plotted for the full wavelength range. The table shows the average total transmission values for all wavelengths across all incident angles and within the range of 700 nm to 1000 nm.

As shown, the nanostructures 22 of the present technology effectively induce asymmetric light propagation across various incident angles within the 800-nm-wide broadband wavelength range (i.e. 400 nm to 1200 nm). At 700 nm there is about a 53% difference in total transmission and an average transmission difference of about 35% for the entire range. While spectrally selective mirrors may be more effective than 50%, they are only effective within a very small bandgap. Not only that, as previously mentioned, they block incoming light as well as trapping light inside the LSC substrate material. The present technology offers a wide bandgap solution that allows light to enter across an 800-nm-wide range while simultaneously preventing more than 50% of that light from leaving at any wavelength.

Figure 6:
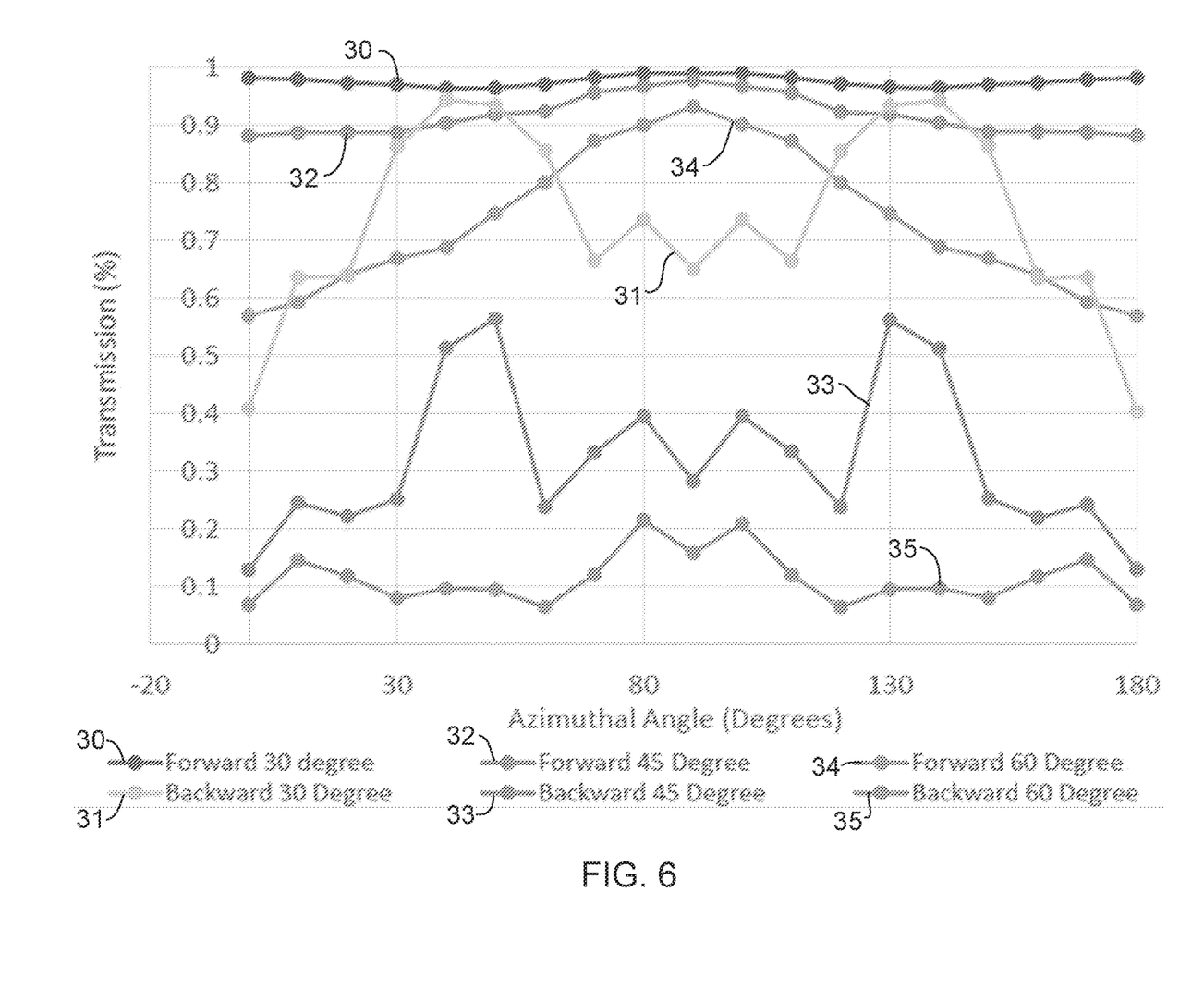
FIG. 6 is a chart showing the total transmission results for varying the azimuthal angle over several constant incident angles at an exemplary wavelength of 720 nm.

In some embodiments, to further prove the viability of the nanostructure 22 when implemented with LSCs, a model was created that varied the azimuthal angle of the propagating light for several different polar angles. The results for this are shown in FIG. 6. Due to the symmetric design of the nanostructures 22, it is only necessary to model the nanostructures 22 rotationally by 180°. In some embodiments, this was modeled for three constant incident angles: 30° (forward direction labeled 30, backward direction labeled 31), 45° (forward direction labeled 32, backward direction labeled 33), and 60° (forward direction labeled 34, backward direction labeled 35). In one such embodiment, this was only modelled at 720 nm, which was found to be the most effective wavelength. For each of those constant incident angles, the azimuthal angle was varied from 0° to 180° at 10° intervals. As shown, asymmetric light propagation continued to hold and be very effective across all combinations of polar and azimuthal angles. This simulation was tested for a variety of other wavelengths that all yielded similar results.

Although the technology has been described and illustrated with respect to exemplary embodiments thereof, it should be understood by those skilled in the art that the foregoing and various other changes, omissions, and additions may be made therein and thereto, without parting from the spirit and scope of the present technology.

What is claimed is:

1. A luminescent solar concentrator, comprising:
   a light propagation device comprising a plurality of nanostructures configured to permit preferential propagation of a wavelength range of light in one direction, and a plurality of substrates arranged such that each one of the plurality of nanostructures is positioned on a respective one of the plurality of substrates to form a nanostructure-substrate pairing wherein each of the nanostructures are defined by a pyramidal configuration having a top surface and a bottom surface, in which the height of each nanostructure between the top and bottom surfaces is at least equal to or greater than a base width of the bottom surface and wherein each of the substrates are defined by a cuboid configuration in which width dimension is greater than a corresponding height dimension thereof;
   at least one photovoltaic cell positioned adjacent an end of the light propagation device; and
   at least one waveguide configured to guide light toward the at least one photovoltaic cell via total internal reflection within the luminescent solar concentrator and in which the plurality of nanostructure-substrate pairings is arranged in a periodic array having a periodicity in the range of 100 nm to 1000 nm, wherein each of the plurality of nanostructures is configured to permit a first quantity of light to propagate in a forward direction and a second quantity of light to propagate in a backward direction, the first quantity of light being greater than the second quantity of light for the wavelength range and over azimuthal angles ranging between −20 degrees and 180 degrees.

2. The luminescent solar concentrator of claim 1, wherein the wavelength range of light is 400 nm to 1200 nm.

3. The luminescent solar concentrator of claim 1, wherein the wavelength range of light is 700 nm to 1050 nm.

4. The luminescent solar concentrator of claim 1, wherein the plurality of nanostructures each have an aspect ratio of the top surface to the bottom surface of 0.55.

5. The luminescent solar concentrator of claim 1, wherein the plurality of nanostructures each have a base width in the range of 200 nm to 800 nm and a height in the range of 200 nm to 800 nm.

6. The luminescent solar concentrator of claim 1, wherein the plurality of nanostructures each have a base width of 550 nm and a height of 550 nm.

7. The luminescent solar concentrator of claim 1, wherein the plurality of substrates each have a width in the range of 400 nm to 1000 nm and a height in the range of 200 nm to 800 nm.

8. The luminescent solar concentrator of claim 1, wherein the plurality of substrates each have a width of 700 nm and a height of 550 nm.

9. The luminescent solar concentrator of claim 1, wherein the periodic array defined by the plurality of nanostructure-substrate pairings has a periodicity of 700 nm.

10. The luminescent solar concentrator of claim 1, wherein the plurality of nanostructures comprises aluminum oxide.

11. The luminescent solar concentrator of claim 1, wherein the plurality of substrates comprises polymethylmethacrylate.

* * * * *